(12) United States Patent
Ishiguro et al.

(10) Patent No.: US 8,665,357 B2
(45) Date of Patent: Mar. 4, 2014

(54) IMAGING APPARATUS

(75) Inventors: Hideto Ishiguro, Shiojiri (JP); Hitoshi Tsuchiya, Suwa (JP); Tsukasa Eguchi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/421,295

(22) Filed: Mar. 15, 2012

(65) Prior Publication Data
US 2012/0242884 A1 Sep. 27, 2012

(30) Foreign Application Priority Data

Mar. 23, 2011 (JP) ................. 2011-063926

(51) Int. Cl.
*H04N 5/225* (2006.01)

(52) U.S. Cl.
USPC .............. 348/340; 348/294; 348/61; 382/124

(58) Field of Classification Search
USPC .............. 348/335, 340, 77, 294, 61; 382/124, 382/127, 128, 321, 115; 250/208.1
See application file for complete search history.

(56) References Cited

U.S. PATENT DOCUMENTS

| | | | |
|---|---|---|---|
| 7,218,452 B2 * | 5/2007 | Boettiger et al. | 359/619 |
| 7,999,853 B2 | 8/2011 | Naito et al. | |
| 8,085,312 B2 * | 12/2011 | Morita et al. | 348/222.1 |
| 2001/0026322 A1 * | 10/2001 | Takahashi et al. | 348/340 |
| 2008/0031497 A1 | 2/2008 | Kishigami et al. | |
| 2010/0067757 A1 * | 3/2010 | Arai et al. | 382/128 |
| 2012/0257031 A1 | 10/2012 | Tsuchiya et al. | |

FOREIGN PATENT DOCUMENTS

| | | |
|---|---|---|
| JP | A-2008-036058 | 2/2008 |
| JP | A-2009-100104 | 5/2009 |
| JP | A-2012-217571 | 11/2012 |

* cited by examiner

*Primary Examiner* — Tuan Ho
*Assistant Examiner* — Zhenzhen Wu
(74) *Attorney, Agent, or Firm* — Oliff PLC

(57) ABSTRACT

An imaging apparatus includes light-transmitting substrate; a plurality of lenses which faces a first surface of the substrate; a light shielding layer which is formed on the second surface of the substrate and has an opening section through which optical axes of each lens pass; and a plurality of light sensing elements which is placed so that the optical axes of the lenses pass through a light sensing surface facing the second surface at an interval. An efficient diameter of the lens, a diameter of the opening section, a distance between the light sensing surfaces and the light shielding layer, a diameter of the light sensing surface, and a distance between the light sensing surface and center of the lens satisfy $a<(h\cdot D+h\cdot d-s\cdot d)/s$ and $\tan^{-1}\{(p-a/2-d/2)/h\}>\sin^{-1}(1/n)$.

11 Claims, 5 Drawing Sheets

IMAGING APPARATUS

BACKGROUND

1. Technical Field

The present invention relates to an imaging apparatus.

2. Related Art

JP-A-2008-36058 discloses an imaging apparatus which images a vein image of a living body for biometric identification. As shown in FIG. 9, the imaging apparatus of JP-A-2008-36058 includes a light sensing section 92 with a plurality of light sensing elements 921 arranged thereon, a lens array 94 including lenses (micro lenses) 941 corresponding to the respective light sensing elements 921, and a light shielding layer 96 interposed between the light sensing section 92 and the lens array 94. The light shielding layer 96 is constituted by a light shielding plate-like member, and has a structure in which an optically transparent light transmitting section 961 is filled to a cylindrical opening section corresponding to the respective light sensing elements 921.

However, the technique of JP-A-2008-36058 has a problem in that the light shielding layer 96 has a complicated structure. If a substrate formed with a light shielding layer of a thin film type having opening sections for the respective light sensing elements is used instead of the light shielding layer 96 of JP-A-2008-36058, the configuration is simplified, but there is a problem (hereinafter, the phenomenon is called "beam crosstalk") in that light from outside the lens reaches the light sensing elements corresponding to the respective lenses.

SUMMARY

An advantage of some aspects of the invention is to simplify a configuration of an imaging apparatus while preventing beam crosstalk.

According to an aspect of the invention, there is provided an imaging apparatus that includes a first light-transmitting substrate (for example, a substrate 32) including a first surface and a second surface of an opposite side of the first surface; a plurality of lenses which is placed in a planar shape along the first surface and concentrates incident light, respectively; a light shielding layer which is formed on the second surface and has an opening section through which optical axes of each lens pass; and a plurality of light sensing elements which is placed in a planar shape corresponding to each lens so that optical axes of the lenses pass through a light sensing surface facing the second surface at an interval, wherein, in a reference surface passing through the respective optical axes of the first lens (for example, a lens 44[1]) and the second lens (for example, a lens 44[2]) adjacent to each other among the plurality of lenses, a diameter (for example, a diameter a) of the opening section corresponding to the first lens is set so as to be lower than a diameter (for example, a diameter a0) of a reference region which is defined as an intersection point (for example, an intersection point C1) between a straight line (for example, a straight line LA) reaching from a periphery (for example, a point QA1) of an effective diameter of the first lens to a periphery (for example, a point QA2) of a light sensing surface of a light sensing element corresponding to the first lens through an optical axis of the first lens and the second surface of the first substrate, and, in a region between an optical axis of the first lens and an axis of the second lens in the reference surface, an angle (for example, an angle θ), which is formed by a straight line (for example, a straight line LB) passing through a periphery (for example, a point QB1) of an opening section corresponding to the second lens, a periphery (for example, a point QB2) of a light sensing surface of the light sensing element corresponding to the first lens, and the optical axis of the second lens is greater than a maximum refraction angle (for example, a maximum refraction angle αm) of incident light to the first surface.

In the configuration mentioned above, since the light shielding layer formed with the opening sections for each lens is formed on the second surface of the first substrate, there is an advantage that the configuration is simplified compared to the configuration of JP-A-2008-36058 in which the light transmitting sections are inserted into each opening section of the light shielding plate-like member. Furthermore, since the diameter of the opening section corresponding to the first lens is smaller than that of the reference region (a first condition), an ingredient coming from the outside of the first lens, of light passing through the opening section corresponding to the first lens does not reach the light sensing surface of the light sensing element corresponding to the first lens.

Furthermore, since an angle of the straight light connecting the opening section corresponding to the second lens with the light sensing surface corresponding to the first lens is greater than the maximum refraction angle (a second condition), light passing through the opening section corresponding to the second lens does not reach the light sensing surface of the light sensing element corresponding to the first lens. That is, it is possible to prevent beam crosstalk to each light sensing element.

In the imaging apparatus, an efficient diameter D of each lens, a diameter a of each opening section of the light shielding layer, a distance h between the light sensing surfaces of the respective light sensing elements and the surface of the light shielding layer, diameters d of each light sensing surface, and a distance s between the respective light sensing surfaces and centers of each lens may satisfy a relationship of formula (A) as below.

$$a < (h \cdot D + h \cdot d - s \cdot d)/s \qquad (A)$$

In the configuration mentioned above, since dimensions of each element of the imaging apparatus satisfy the relationship of formula (A), the ingredient coming from the outside of the first lens, of light passing through the opening section corresponding to the first lens does not reach the light sensing surface of the light sensing element corresponding to the first lens.

In the imaging apparatus, the diameter a of each opening section of the light shielding layer, a pitch p of a plurality of light sensing elements, the distance h between the light sensing surfaces of each light sensing element and the surface of the light shielding layer, the diameter d of each light sensing surface, and a refractive index n of the first substrate may satisfy a relationship of formula (B) as below.

$$\tan^{-1}\{(p-a/2-d/2)/h\} > \sin^{-1}(1/n) \qquad (B)$$

In the configuration mentioned above, since the dimensions of each element of the imaging apparatus satisfy the relationship of formula (B), light passed through the opening section corresponding to the second lens does not reach the light sensing surface of the light sensing element corresponding to the first lens.

The imaging apparatus may further include a second substrate (for example, a substrate 42) facing the first surface of the first substrate at an interval, and a plurality of lenses may be formed on a surface (for example, a surface 421) of the second substrate facing the first substrate. Furthermore, it is preferable that, thermal expansion coefficients of the first substrate and the second substrate are equal to each other. In the aspect mentioned above, since the thermal expansion coefficients of the first substrate and the second substrate are common to each other, it is possible to prevent a deviation of a position between each lens and each opening section, and a thermal stress of the first substrate and the second substrate. Meanwhile, in a configuration (for example, a second embodiment mentioned below) in which a plurality of lenses is formed on the first surface of the first substrate, there is an advantage that the imaging apparatus is thin.

The imaging apparatus may further include a third substrate (for example, a substrate 52) facing the second surface of the first substrate at an interval, and the plurality of light sensing elements may be formed on a surface (for example, a surface 521) of the third substrate facing the first substrate. It is preferable that the first substrate and the third substrate may be equal to each other in thermal expansion coefficients. In the configuration mentioned above, since the first substrate may be common to the third substrate in thermal expansion efficiency, it is possible to prevent a position deviation between each opening section and each light receiving element and the thermal stress of the first substrate and the third substrate.

The imaging apparatus may further include a light-transmitting filling layer that is interposed between the second substrate and the third substrate. According to a configuration in which the refractive index of the filling layer approximately coincides with the refractive index of the first substrate, since light incident to the first substrate goes straight to an interface (the second surface) between the first substrate and the filling layer, it is possible to effectively prevent beam crosstalk by selecting the dimensions of each element so as to satisfy formula (B).

BRIEF DESCRIPTION OF THE DRAWINGS

The invention will be described with reference to the accompanying drawings, wherein like numbers reference like elements.

DESCRIPTION OF EXEMPLARY EMBODIMENTS

A: First Embodiment

Figure 1:
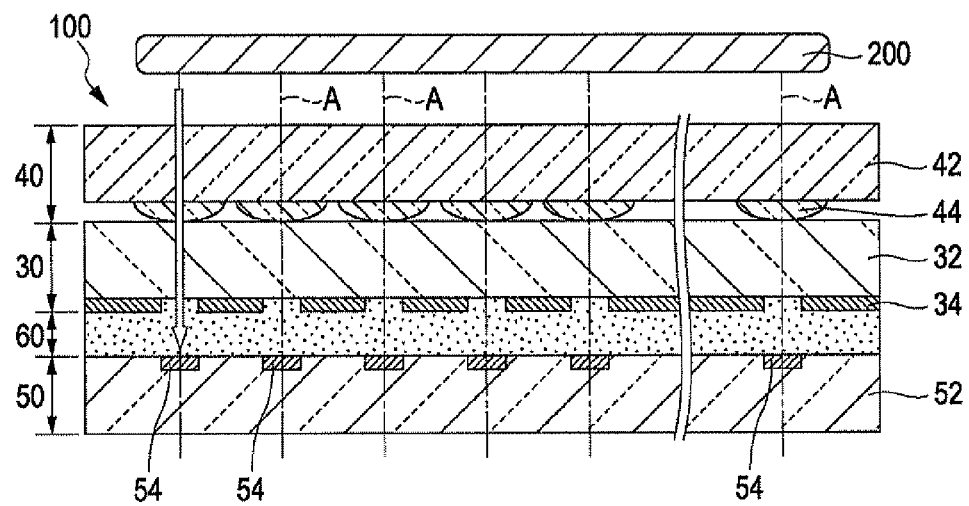
FIG. 1 is a cross-sectional view of an imaging apparatus according to a first embodiment of the invention.
Figure 2:
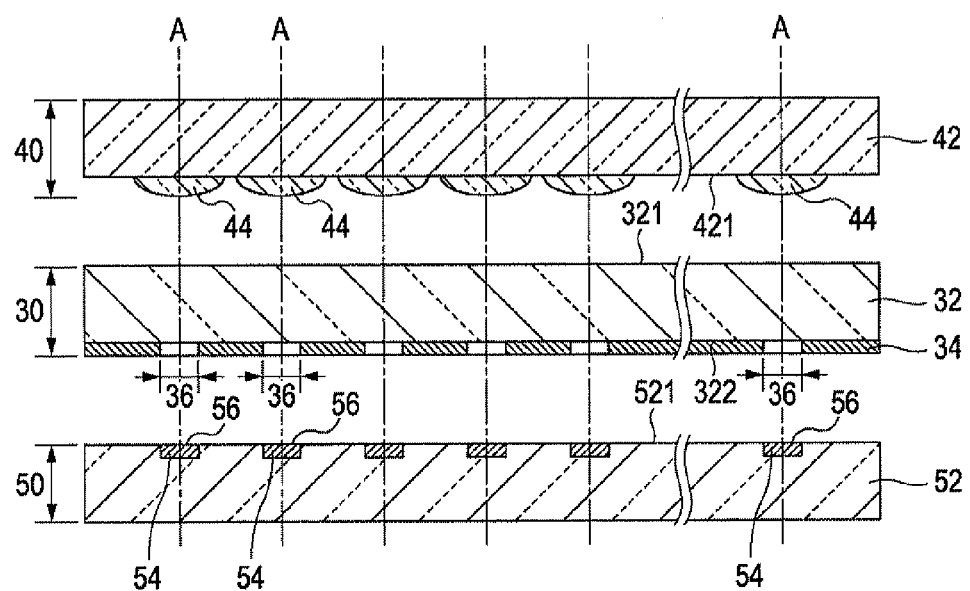
FIG. 2 is an exploded cross-sectional view of the imaging apparatus.

FIG. 1 is a cross-sectional view of an imaging apparatus 100 according to a first embodiment of the invention, and FIG. 2 is an exploded cross-sectional view of the imaging apparatus 100. The imaging apparatus 100 is a living body identification apparatus (a vein sensor) that images a vein image of a living body 200 (for example, fingers of a human) for living body identification, and includes a light shielding substrate 30, a light concentrating substrate 40, and a light sensing substrate 50, as shown in FIGS. 1 and 2. The light concentrating substrate 40 is interposed between the light sensing substrate 50 and the living body 200 (a subject), and the light shielding substrate 30 is interposed between the light concentrating substrate 40 and the light sensing substrate 50.

The light shielding substrate 30 includes a substrate 32 and a light shielding layer 34. As shown in FIG. 2, the substrate 32 is an optically transparent plate-like member including a surface (hereinafter, referred to as a "first surface") 321 of the light concentrating substrate 40 side, and a surface (hereinafter, referred to as a "second surface") 322 of the light sensing substrate 50 side. For example, a glass substrate is preferably used as the substrate 32. The light shielding layer 34 is a light shielding thin film formed on the second surface 322 of the substrate 32. As shown in FIG. 2, the light shielding layer 34 is formed with a plurality of opening sections 36.

The light concentrating substrate 40 includes a substrate 42 and a plurality of lenses (micro lenses) 44. The substrate 42 is an optically transmitting plate-like member having the same thermal expansion coefficients (linear expansion coefficient) as those of the substrate 32. A thickness of the substrate 42 is about 0.5 mm. For example, like the substrate 32 of the light shielding substrate 30, the glass substrate is preferably used as the substrate 42. The plurality of lenses 44 is formed on the surface 421 of the substrate 42 facing to the first surface 321 of the light shielding substrate 30 and is arranged in a matrix shape. The respective lenses 44 are convex lenses that concentrate incident light from the living body 200 side. In addition, it is also possible to integrally form the substrate 42 and the plurality of lenses 44. A radius of curvature of the lens 44 is set to, for example, about 160 μm.

As shown in FIG. 1, an interval between the substrate 32 and the substrate 42 is defined such that the surfaces of the plurality of lenses 44 face and come into contact with the first surface 321 of the light shielding substrate 30. The respective opening sections 36 of the light shielding layer 34 are approximately circular light transmitting regions formed corresponding to the respective lenses 44 of the light concentration substrate 40 one-to-one. Optical axes of the lenses 44 pass through centers of the opening sections 36 corresponding to the lenses 44.

The light sensing substrate 50 includes a substrate 52, and a plurality of light sensing elements 54. The substrate 52 is an optically transparent plate-like member having the same thermal expansion coefficients (the line expansion coefficients) as those of the substrate 32 and the substrate 42. For example, like the substrate 32 of the light shielding substrate 30 and the substrate 42 of the light concentrating substrate 40, the glass substrate is suitable as the substrate 52. The light shielding substrate 30 and the light sensing substrate 50 are fixed to each other by a filling layer 60 (an adhesive) filled therebetween. The filling layer 60 is formed of a material (for example, a resin material) having the same refractive index as that of the substrate 32.

As shown in FIG. 2, the plurality of light sensing elements 54 is formed on the surface 521 of the substrate 52 facing the second surface 322 of the light sensing substrate 30 and is arranged in a matrix shape. The respective light sensing elements 54 create a detection signal depending on an amount of light incident to the approximately circular light sensing surface 56 facing the second surface 322. The respective lenses 44 of the light concentrating substrate 40 correspond to the respective light sensing elements 54 of the light sensing substrate 50 one to one. Specifically, the optical axis of the lens 44 passes through the center of the light sensing surface 56 of the light sensing element 54 corresponding to the lens 44. In addition, in the production of the light sensing substrate 50, for example, a technique disclosed in JP-A-2009-100104 can be used.

In the configuration mentioned above, as shown by an arrow in FIG. 1, irradiation light by a light source (not shown) placed in a predetermined position (for example, an opposite side of the light concentrating substrate 40 with the living body 200 interposed therebetween) is transmitted or reflected by a vein of the inner portion of the living body 200, is incident to the light concentrating substrate 40, and is concentrated by the respective lenses 44, and then, irradiation light passes through the opening section 36 of the light shielding layer 34 and reaches the light sensing surface 56 of the light sensing element 54. That is, the vein image of the living body 200 is imaged. The respective opening sections 36 of the light shielding layer 34 function as a unit for limiting the incident light to the light sensing element 54 corresponding to the opening section 36.

According to the configuration mentioned above, since the light shielding layer 34 formed with the opening sections 36 for each light sensing element 54 is formed on the second surface 322 of the substrate 32, there is an advantage that the configuration of the imaging apparatus 100 is simplified compared to the technique of JPA-2008-36058 which adopts the light shielding layer 34 filled with the light transmitting section 961 in the opening section of the optically transmitting plate-like member.

However, in the technique of JP-A-2008-36058, the light receiving section 92 is formed of silicon, the lens array 94 is formed of quartz, and the light shielding layer 96 is formed of a resin material. That is, the thermal expansion coefficients of each element are significantly different from each other. Thus, for example, there is a problem in that it is difficult to mate the respective positions of the lens 941, the light transmitting section 961 of the light shielding layer 96, and the light sensing element 921 with high accuracy. Furthermore, there is also a problem in that thermal stress due to a difference in the thermal expansion coefficients is generated in each element. Meanwhile, in the first embodiment, since the thermal expansion coefficients of the substrate 32, the substrate 42, and the substrate 52 are common to each other, there is an advantage that it is possible to prevent an error of position of the lens 44, the opening section 36, and the light sensing element 54, and suppress an occurrence of thermal stress of the respective elements (the light sensing substrate 40, the light shielding substrate 30, and the light sensing substrate 50). Of course, if a difference in the thermal expansion coefficients is not an issue, it is also possible to adopt a configuration having different thermal expansion coefficients between the substrate 32 and the substrate 42, and a configuration having different thermal expansion coefficients between the substrate 42 and the substrate 52.

Figure 3:
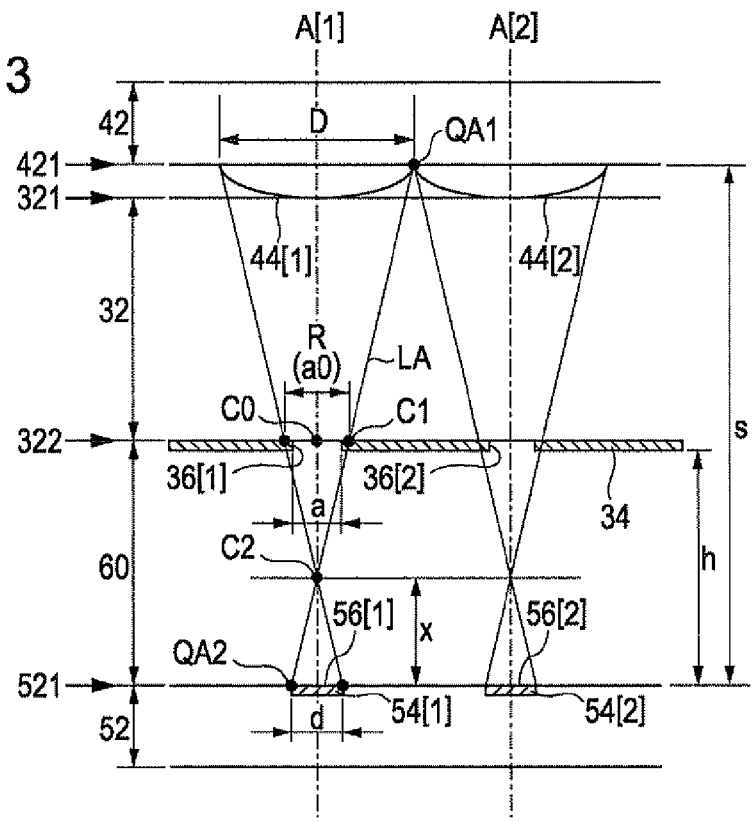
FIG. 3 is an explanatory diagram of a first condition for preventing beam crosstalk.
Figure 4:
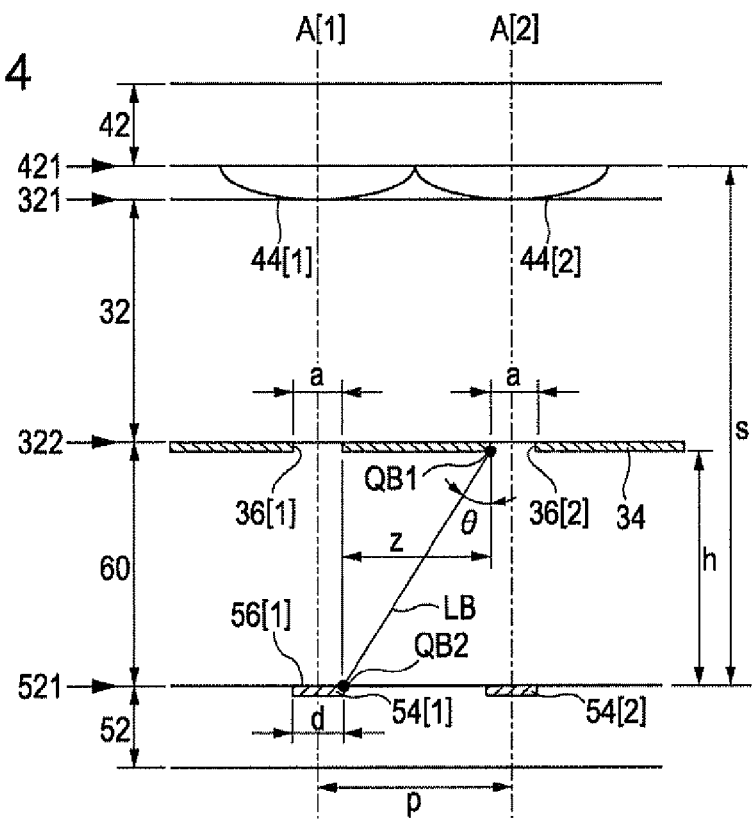
FIG. 4 is an explanatory diagram of a second condition for preventing beam crosstalk.

The dimensions of each element of the imaging apparatus 100 are selected so as to prevent beam crosstalk. As shown in FIGS. 3 and 4, conditions of dimensions of each element will be described in detail focusing on an arbitrary one lens 44[1] of the plurality of lenses 44 of the light concentrating substrate 40 and one lens 44[2] adjacent to the lens 44[1]. In the description below, reference numerals of element (an optical axis A, an opening section 36, a light sensing element 54, and a light sensing surface 56) corresponding to the lens 44[1] are conveniently added with a subscript [1], and a reference numeral of the element corresponding to the lens 44[2] is added with a subscript [2]. FIGS. 3 and 4 are cross-sectional views of the imaging apparatus 100 in a plane (hereinafter, also referred to as a "reference surface") passing through the optical axis A[1] of the lens 44[1] and the optical axis A[2] of the lens 44[2]. In addition, in FIGS. 3 and 4, for the purpose of preventing the complication of the drawings, hatching of each element was omitted.

The dimensions of each element of the imaging apparatus 100 are selected so as to satisfy a first condition (FIG. 3) and a second condition (FIG. 4) for preventing beam crosstalk. The first condition is a condition in which only light of a beam passing through the opening section 36[1] transmitted through the lens 44[1] is incident to the light sensing surface 56[1] of the light sensing element 54[1] (that is, light coming from outside the lens 44[1] and passing through the opening section 36[1] reaches the outside of the light sensing surface 56[1]). A second condition is a condition in which light transmitted through the opening section 36[2] is not incident to the light sensing surface 56[1] of the light sensing element 54[1] (reaches the outside of the light sensing surface 56[1]). Each of the first condition and the second condition will be described below in detail.

First Condition

As shown in FIG. 3, a straight line LA is assumed in the reference surface. The straight line LA is a straight line which intersects with the optical axis A[1] of the lens 44[1] from a point QA1 on the periphery of the lens 44[1], and reaches a point QA2 on the periphery of the light sensing surface 56[1] of the light sensing element 54[1]. The points QA1 and QA2 are situated at opposite sides in the reference surface with the optical axis A[1] interposed therebetween. The reference region R is defined by an intersection point C1 between the straight line LA and the second surface 322 of the substrate 32 of the light shielding substrate 30. That is, the reference region R is a circular region which sets the intersection point C1 as a point on the periphery around an intersection point C0 between the second surface 322 and the optical axis A[1]. The diameter a0 of the reference region R is equivalent to twice a distance (that is, a radius) between the intersection point C0 and the intersection point C1.

As will be understood from FIG. 3, if the diameters a of each opening section 36 are selected so that the diameter a of the opening section 36[1] is smaller than the diameter a0 of the reference region R (a<a0), light which comes from the region outside the lens 44[1] and passes through the opening section 36[1] reaches the outside of the light sensing surface 56[1]. That is, the first condition is satisfied.

As will be understood geometrically from FIG. 3, the diameter a0 of the reference region R, the diameter d of the light sensing surface 56111, a distance h between the light sensing surface 56[1] (the surface 521 of the substrate 52) and the surface of the light shielding layer 34, and a distance x along the optical axis A[1] satisfy formula (a1) as below. As shown in FIG. 3, the distance x is a distance from the intersection point C2 between the straight line LA and the optical axis A[1] from the light sensing surface 56[1].

$$a0/(h-x)=d/x \tag{a1}$$

Formula (a2) is derived from formula (a1) as below.

$$a0=d(h-x)/x \tag{a2}$$

Furthermore, the diameter (the efficient diameter) D of the lens 44[1], and a distance s between the light sensing surface 56[1] and the center (the surface 421 of the substrate 42) of the lens 44[1] satisfy formula (a3) as below.

$$D/(s-x)=d/x \tag{a3}$$

Formula (a4) is derived from formula (a3) as below.

$$x=d \cdot s/(D+d) \tag{a4}$$

Formula (a5) is derived by substituting formula (a4) to formula (a1).

$$a0 = (h \cdot D + h \cdot d - s \cdot d)/s \quad (a5)$$

From the condition in which the diameter a of the opening section 36[1] is smaller than the diameter a0 of the reference region R (a<a0), and from formula (a5), following formula (A) expressing the first condition is derived. The diameters a of each opening section 36 of the light shielding layer 34 are selected so as to satisfy formula (A).

$$a < (h \cdot d + h \cdot d - s \cdot d)/s \quad (A)$$

Second Condition

AS shown in FIG. 4, a straight line LB is assumed in the reference surface. The straight line LB is a straight line which passes through a point QB1 on the periphery of the opening section 36[2] and a point QB2 on the periphery of the light sensing surface 56[1] of the light sensing element 54[1] in the region between the optical axis A[1] of the lens 44[1] and the optical axis A[2] of the lens 44[2]. The straight line LB forms an angle θ to the optical axis A[2] of the lens 44[2].

As will be understood from FIG. 4, if the angle θ of the straight line LB is greater than a maximum value (hereinafter, referred to as a "maximum refractive angle") αm of the angle α which is formed by light passing through the opening section 36[2] and advancing to the inner section of the filling layer 60 to the optical axis A[2] (θ>α), light passed through the opening section 36[2] does not reach the light sensing surface 56[1]. That is, the second condition is satisfied.

Figure 5:
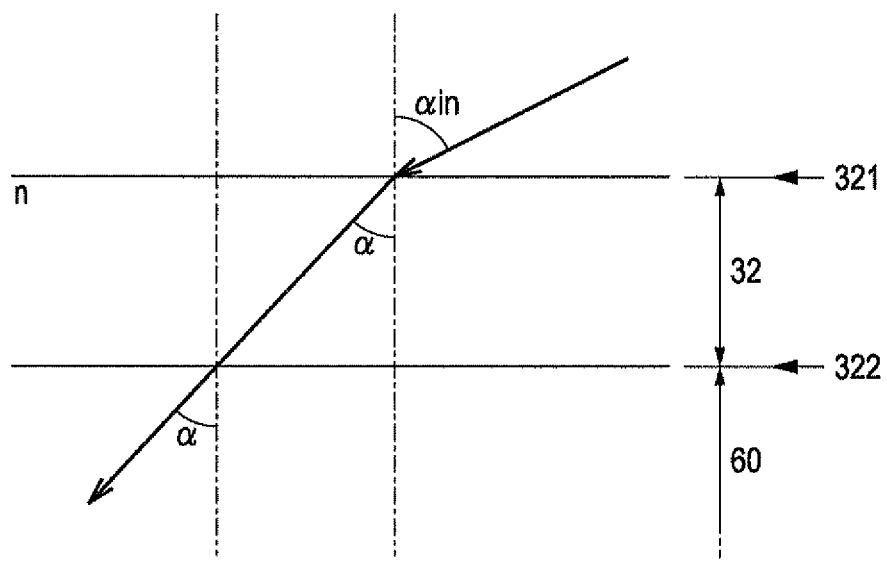
FIG. 5 is an explanatory diagram of an angle of light propagating an inner portion of a filling layer.

As shown in FIG. 5, a case is assumed where light is incident from air to the first surface 321 of the substrate 32 of the light shielding substrate 30 at the incident angle αin. The relationship between the incident angle αin and the refractive angle α in the first surface 321 is expressed by the following formula (b1) including the refractive index n of the substrate 32.

$$\sin(\alpha) = \sin(\alpha in)/n \quad (b1)$$

If it is assumed that the refractive index of the filling layer 60 is equal to the refractive index n of the substrate 32, light incident to the first surface 321 of the substrate 32 goes straight to the boundary surface (the second surface 322) between the substrate 32 and the filling layer 60, and is transmitted through the inner portion of the filling layer 60 at the refractive angle α satisfying formula (b1). The maximum refractive angle αm in the inner portion of the filling layer 60 is equivalent to a case of setting the incident angle αin of formula (b1) to 90° (sin (αm)=sin (90°/n). Thus, formula (b2) expressing the maximum refractive angle αm is derived as below.

$$\alpha m = \sin^{-1}(1/n) \quad (b2)$$

Meanwhile, as will be geometrically understood from FIG. 4, the distance z between the point QB1 and the point QB2 in a direction parallel to the second surface 322 is expressed by formula (b3) as below. A sign p of formula (b3) means a pitch (that is, a distance of a center between the light sensing surface 56[1] and the light sensing element 56[2]) of the light sensing element 54[1] and the light sensing element 54[2].

$$z = p - a/2 - d/2 \quad (b3)$$

Thus, the angle θ between the straight line LB and the optical axis [2] satisfies formula (b4) including the distance z and the distance h (the distance of the surface between the light sensing surface 56[2] and the light shielding layer 34) as below.

$$\tan(\theta) = z/h \quad (b4)$$
$$= (p - a/2 - d/2)/h$$

Formula (b5) is derived from formula (b4).

$$\theta = \tan^{-1}\{(p - a/2 - d/2)/h\} \quad (b5)$$

From the condition in which the angle θ of the straight line LB is greater than the maximum refractive angle (θ>αm), and from formula (b2) and formula (b5), formula (B) expressing the second condition is derived as below.

$$\tan^{-1}\{(p - a/2 - d/2)/h\} > \sin^{-1}(1/n) \quad (B)$$

The dimensions of each element of the imaging apparatus 100 are selected so as to satisfy formula (A) and formula (B). Thus, light which came from outside the lens 44[1] and passed through the opening section 36[1] is not incident to the light sensing surface 56[1] (formula (A): the first condition), meanwhile, light passed through the opening section 36[2] is not incident to the light sensing surface 56[1] (formula (B): the second condition). That is, according to the first embodiment, it is possible to prevent beam crosstalk to the respective light sensing elements 54.

For example, when the diameter D of the lens 44, and the pitch p and the distance h of the light sensing element 54 are 100 μm, the diameter d of the light sensing element 54 is 10 μm, and the distance s is 400 μm, a right side of the formula (A) is 17.5 μm. Thus, the diameters a of the respective opening sections 36 are set to, for example, 15 μm within the range satisfying the formula (A). Furthermore, under the condition mentioned above, the angle θ (a left side of the formula (B)) is about 41.19°. When the refractive index n of the filling layer 60 of the substrate 32 is 1.53, since the maximum refractive angle αm (a right side of the formula (B)), the condition of the formula (B) is satisfied. As mentioned above, since both of the formula (A) and the formula (B) are satisfied, it is possible to prevent beam crosstalk to the respective light sensing elements 54.

B: Second Embodiment

A second embodiment of the invention will be described below. In addition, elements having the same action and the function as those of the first embodiment in each configuration described as an example as below are denoted by the reference numerals referred to in the above description, and the detailed descriptions thereof will be appropriately omitted.

Figure 6:
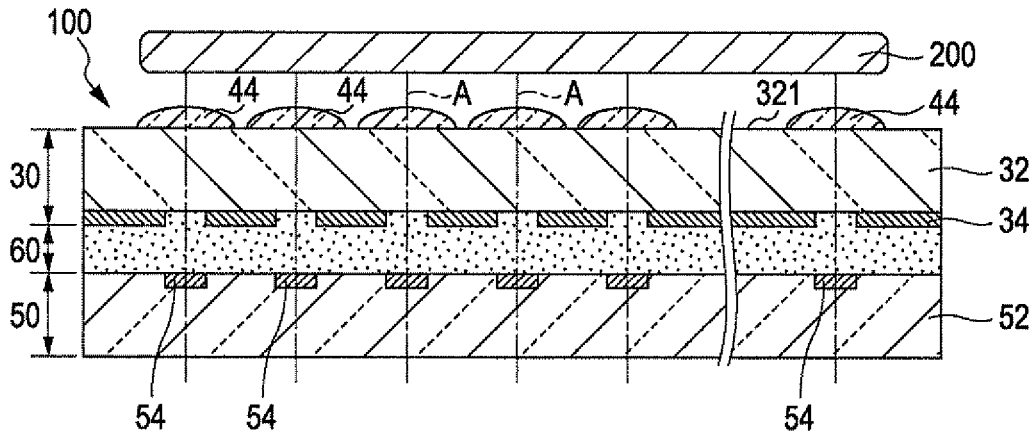
FIG. 6 is a cross-sectional view of an imaging apparatus according to a second embodiment.

FIG. 6 is a cross-sectional view of an imaging apparatus 100 of the second embodiment. As shown in FIG. 6, in the imaging apparatus 100 of the second embodiment, a plurality of lenses 44 is formed on the first surface 321 of the substrate 32 of the light shielding substrate 30 facing the living body 200. The respective lenses 44 concentrate light coming from the living body 200, like the first embodiment.

In the second embodiment, the dimensions of each element of the imaging apparatus 100 are selected so as to satisfy the first condition and the second condition. Thus, the same effect as the first embodiment is realized. Furthermore, since the plurality of lenses 44 is formed on the substrate 32 in the second embodiment, the substrate 32 of the first embodiment is unnecessary. Thus, it is possible to make the imaging apparatus 100 thinner than the first embodiment.

C: Third Embodiment

Figure 7:
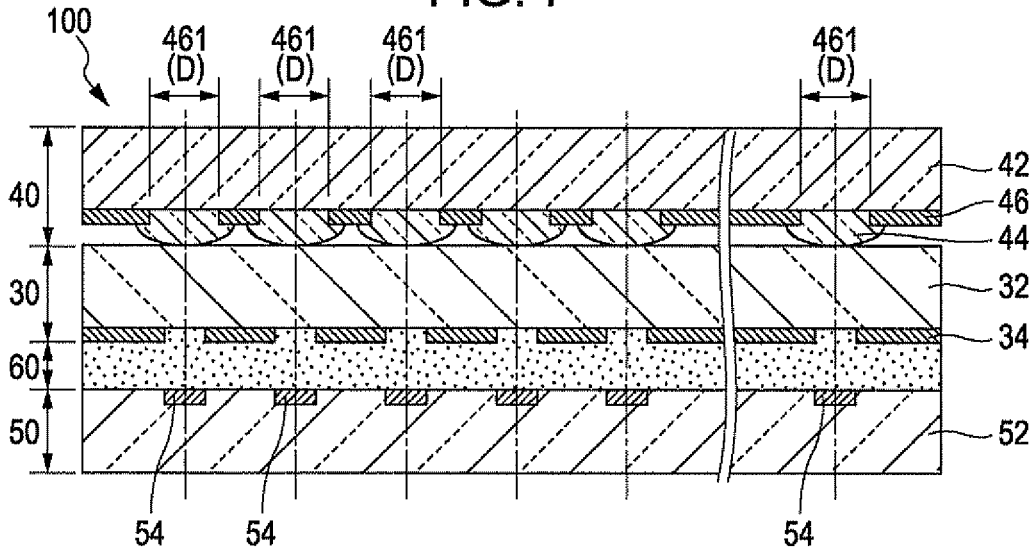
FIG. 7 is a cross-sectional view of an imaging apparatus according to a third embodiment.

FIG. 7 is a cross-sectional view of an imaging apparatus 100 of a third embodiment. As shown in FIG. 7, the imaging apparatus 100 of the third embodiment has a configuration in which a light shielding layer 46 interposed between the substrate 42 and the plurality of lenses 44 is added to the light concentrating substrate 40. The light shielding layer 46 is formed with a circular opening section 461 corresponding to each lens 44. In light incident from the living body 200 to the substrate 42, light passed through the opening section 461 is concentrated by the respective lenses 44.

A dimension D of formula (A) in the third embodiment is a diameter of the opening section 461 of the light shielding layer 46. That is, the diameter of the lens 44 in the first embodiment and the diameter of the opening section 461 of the third embodiment are included as the effective diameter D of the lens 44. In the third embodiment, the same effect as that of the first embodiment is also realized.

D: Fourth Embodiment

Figure 8:
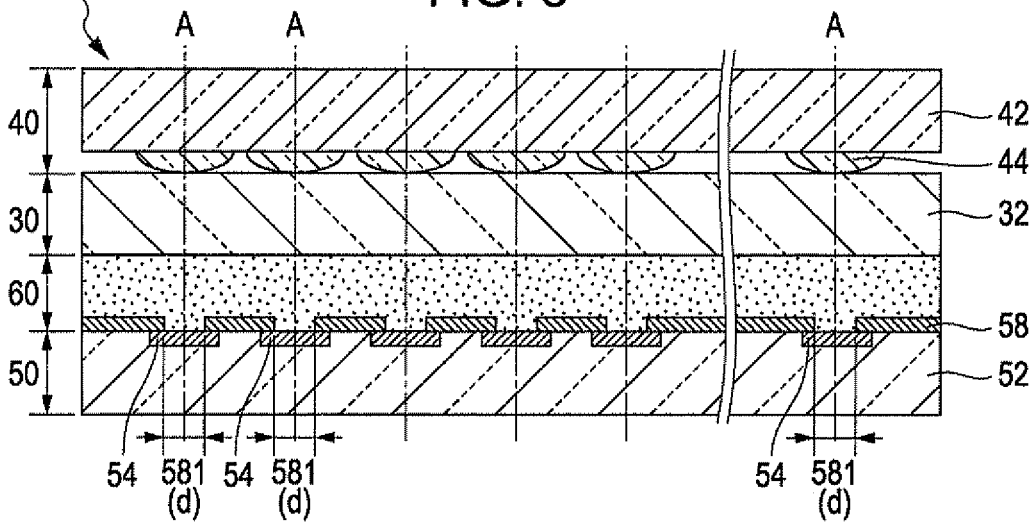
FIG. 8 is a cross-sectional view of an imaging apparatus according to a fourth embodiment.
Figure 9:
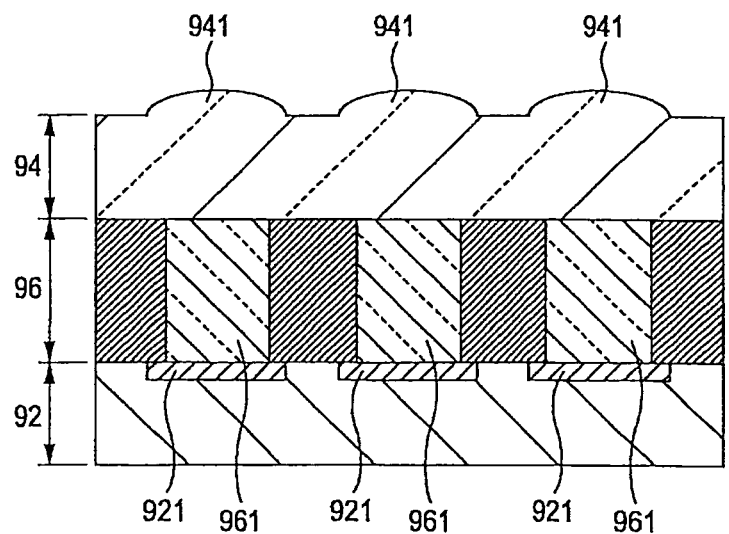
FIG. 9 is a cross-sectional view of an imaging apparatus of JP-A-2008-36058.

FIG. 8 is a cross-sectional view of an imaging apparatus 100 of a fourth embodiment. As shown in FIG. 8, the imaging apparatus 100 of the fourth embodiment has a configuration in which a light shielding layer 58 covering the surface 521 of the substrate 52 to the light sensing substrate 50. The light shielding layer 58 is formed with circular opening sections 581 corresponding to the respective light sensing elements 54. Light transmitted through the substrate 32 and the filling layer 60 passes though the opening sections 581 and is incident to the light sensing elements 54.

The dimension d of the formula (A) and the formula (B) in the fourth embodiment is a diameter of the opening section 581 of the light shielding layer 58. That is, a region of the surface of the light sensing element 54 to be exposed to the inside of the opening section 581 functions as the light sensing surface 56. In the fourth embodiment, the same effect as that of the first embodiment is also realized.

The entire disclosure of Japanese Patent Application No. 2011-063926, filed Mar. 23, 2011 is expressly incorporated by reference herein.

What is claimed is:

1. An imaging apparatus comprising:
a first light-transmitting substrate which includes a first surface and a second surface on an opposite side of the first surface;
a plurality of lenses which is placed in a planar shape along the first surface and concentrates incident light, respectively;
a light shielding layer which is formed on the second surface and has a plurality of opening sections, the opening sections through which optical axes of each lens passes; and
a plurality of light sensing elements which is placed in a planar shape corresponding to each lens so that the optical axes of the lenses pass through a light sensing surface facing the second surface at an interval,
wherein:
in a reference surface passing through the respective optical axes of the first lens and the second lens adjacent to each other among the plurality of lenses, a diameter of the opening section corresponding to the first lens is set so as to be lower than a diameter of a reference region which is defined as an intersection point between a straight line reaching from a periphery of an effective diameter of the first lens to a periphery of a light sensing surface of a light sensing element corresponding to the first lens through an optical axis of the first lens and the second surface of the first substrate, and, in a region between an optical axis of the first lens and an axis of the second lens in the reference surface, an angle, which is formed by a straight line passing through a periphery of an opening section corresponding to the second lens and a periphery of a light sensing surface of the light sensing element corresponding to the first lens to the optical axis of the second lens is greater than a maximum refraction angle of incident light to the first surface, and
an efficient diameter D of each lens, a diameter a of each opening section of the light shielding layer, a distance h between the light sensing surfaces of the respective light sensing elements and the surface of the light shielding layer, a diameter d of each light sensing surface, and a distance s between the respective light sensing surfaces and centers of each lens satisfy a relationship of formula (A) as below:

$$a < (h \cdot D + h \cdot d - s \cdot d)/s \quad (A).$$

2. The imaging apparatus according to claim 1,
wherein the diameter a of each opening section of the light shielding layer, a pitch p of a plurality of light sensing elements, the distance h between the light sensing surfaces of each light sensing element and the surface of the light shielding layer, the diameter d of each light sensing surface, and a refractive index n of the first substrate satisfies a relationship of formula (B) as below:

$$\tan^{-1}\{(p-a/2-d/2)/h\} > \sin^{-1}(1/n) \quad (B).$$

3. The imaging apparatus according to claim 1, further comprising:
a second substrate facing the first surface of the first substrate at an interval,
wherein a plurality of lenses is formed on a surface of the second substrate facing the first substrate.

4. The imaging apparatus according to claim 3,
wherein thermal expansion coefficients of the first substrate and the second substrate are equal to each other.

5. The imaging apparatus according to claim 1,
wherein the plurality of lenses is formed on the first surface of the first substrate.

6. The imaging apparatus according to claim 1, further comprising:
a third substrate that faces the second surface of the first substrate at an interval,
wherein the plurality of light sensing elements is formed on a surface of the third substrate facing the first substrate.

7. The imaging apparatus according to claim 6,
wherein the thermal expansion coefficients of the first substrate and the third substrate are equal to each other.

8. The imaging apparatus according to claim 6, further comprising:
a light-transmitting filling layer that is interposed between the second substrate and the third substrate.

9. The imaging apparatus according to claim 8,
wherein refractive index of the filling layer is equal to that of the first substrate.

10. An imaging apparatus comprising:
a first substrate including a first surface and a second surface on an opposite side of the first surface;
a first lens and a second lens placed along the first surface of the first substrate;
a light shielding layer formed on the second surface, the light shielding layer having a first opening section and a second opening section;
a first light sensing element that senses light passing through the first lens and the first opening, the first light sensing element having a first light sensing surface; and a second light sensing element that senses light passing through the second lens and the second opening, the second light sensing element having a second light sensing surface, wherein:

a diameter of the first opening section is set so as to be lower than a diameter of a reference region which is defined as an intersection point between a straight line reaching from a periphery of the first lens to a periphery of the first light sensing surface of the first light sensing element through an first optical axis of the first lens and the second surface of the first substrate, and, an angle, which is formed by a straight line passing through a periphery of the second opening section and a periphery of the first light sensing surface of the first light sensing element to a second optical axis of the second lens is greater than a maximum refraction angle of incident light to the first surface, and an efficient diameter D of each lens, a diameter a of each opening section of the light shielding layer, a distance h between the light sensing surfaces of the respective light sensing elements and the surface of the light shielding layer, a diameter d of each light sensing surface, and a distance s between the respective light sensing surfaces and centers of each lens satisfy a relationship of formula (A) as below:

$$a < (h \cdot D + h \cdot d - s \cdot d)/s \qquad (A).$$

11. An imaging apparatus comprising:

a first substrate including a first surface and a second surface on an opposite side of the first surface;

a first lens and a second lens placed along the first surface of the first substrate;

a light shielding layer formed on the second surface, the light shielding layer having a first opening section and a second opening section;

a first light sensing element that senses light passing through the first lens and the first opening, the first light sensing element having a first light sensing surface;

a second light sensing element that senses light passing through the second lens and the second opening, the second light sensing element having a second light sensing surface; and a first area of the first opening section being less than a second area of a reference region, wherein:

the reference region being defined by interconnections of the second surface and first lines that are the longest among a plurality of second lines connecting a first outer edge of the first lens and a second outer edge of the first light sensing surface, a first angle is greater than a maximum refraction angle of incident light to the first surface, the first angle being formed by a third line to an axis passing through the second opening and the second light sensing surface, the third line being shortest among a plurality of forth lines connecting a third outer edge of the second opening section and the second outer edge of the first light sensing surface, and an efficient diameter D of each lens, a diameter a of each opening section of the light shielding layer, a distance h between the light sensing surfaces of the respective light sensing elements and the surface of the light shielding layer, a diameter d of each light sensing surface, and a distance s between the respective light sensing surfaces and centers of each lens satisfy a relationship of formula (A) as below:

$$a < (h \cdot D + h \cdot d - s \cdot d)/s \qquad (A).$$

* * * * *